(12) United States Patent
Ishikawa et al.

(10) Patent No.: US 9,112,512 B2
(45) Date of Patent: Aug. 18, 2015

(54) CIRCUIT DEVICE, OSCILLATION DEVICE, AND ELECTRONIC APPARATUS

(71) Applicant: Seiko Epson Corporation, Tokyo (JP)

(72) Inventors: Masayuki Ishikawa, Suwa (JP); Takehiro Yamamoto, Suwa (JP)

(73) Assignee: Seiko Epson Corporation (JP)

( * ) Notice: Subject to any disclaimer, the term of this patent is extended or adjusted under 35 U.S.C. 154(b) by 60 days.

(21) Appl. No.: 13/834,702

(22) Filed: Mar. 15, 2013

(65) Prior Publication Data

US 2013/0257550 A1  Oct. 3, 2013

(30) Foreign Application Priority Data

Mar. 27, 2012  (JP) ................. 2012-071422

(51) Int. Cl.
*H03L 5/00* (2006.01)
*H03L 1/02* (2006.01)

(52) U.S. Cl.
CPC . *H03L 5/00* (2013.01); *H03L 1/022* (2013.01)

(58) Field of Classification Search
USPC ................................. 331/109, 162
See application file for complete search history.

(56) References Cited

U.S. PATENT DOCUMENTS 7,236,062 B2 * 6/2007 Chien .................... 331/158
2001/0000214 A1  4/2001 Aragaki
2009/0121799 A1  5/2009 Ishikawa

FOREIGN PATENT DOCUMENTS

| JP | 2001-168642 | 6/2001 |
|---|---|---|
| JP | 2001-217650 | 8/2001 |
| JP | 2004-153433 | 5/2004 |
| JP | 2007-235544 | 9/2007 |
| JP | 2009-124214 | 6/2009 |
| JP | 2009-135650 | 6/2009 |

* cited by examiner

*Primary Examiner* — Joseph Chang
(74) *Attorney, Agent, or Firm* — Harness, Dickey & Pierce, P.L.C.

(57) ABSTRACT

A circuit device includes a current supply circuit adapted to supply an oscillation current, an oscillation circuit having an oscillation transistor for a resonator, and adapted to drive the resonator using the oscillation transistor based on an oscillation current from the current supply circuit, and a control section adapted to control the current supply circuit. If the oscillation circuit is set to an overdrive mode, the oscillation circuit drives the resonator with a higher drive power than the drive power in a normal mode.

10 Claims, 13 Drawing Sheets

| MODE | IOS |
|---|---|
| NORMAL MODE | INL |
| OVERDRIVE MODE | IOV(>INL) |

| | MODE | |
|---|---|---|
| | NORMAL MODE | OVERDRIVE MODE |
| POWER SUPPLY VOLTAGE OF CURRENT SUPPLY CIRCUIT | VREG | VDD |

CIRCUIT DEVICE, OSCILLATION DEVICE, AND ELECTRONIC APPARATUS

BACKGROUND

1. Technical Field

The present invention relates to a circuit device, an oscillation device, an electronic apparatus, and so on.

2. Related Art

In the past, there has been known a temperature compensated quartz crystal oscillator (TCXO). The TCXO is used as a reference signal source or the like of an RF circuit of a wire-less device such as a portable terminal. As related art of the circuit device for realizing the TCXO, there can be cited a technology disclosed in, for example, JP-A-2009-124214 (Document 1).

Incidentally, in an resonator such as a quartz crystal resonator, if the resonator is used in the state in which a foreign matter generated in the manufacturing process is attached to the resonator, there arise a problem, for example, that the oscillation frequency becomes unstable due to the foreign matter, and a problem that the oscillation frequency jumps to a different frequency if the foreign matter attached thereto is detached.

In this case, it is possible to adopt a method of performing overdrive (strong excitation) on the resonator as a unit prior to installing the resonator in the oscillation device to thereby remove the foreign matter.

However, depending on the package structure of the oscillation devices, there are some oscillation devices having a structure difficult to perform such an overdrive test on the unit resonator. Further, even if the package structure of the oscillation device is the structure allowing the overdrive test, there is a problem that it is difficult to provide overdriving electrodes (terminals) due to miniaturization of the package of the oscillation device and the circuit device (IC) incorporated therein.

SUMMARY

An advantage of some aspects of the invention is to provide a circuit device, an oscillation device, an electronic apparatus, and so on capable of realizing the overdrive of the resonator by making efficient use of the circuit element provided to the circuit device.

An aspect of the invention relates to a circuit device including a current supply circuit adapted to supply an oscillation current, an oscillation circuit having an oscillation transistor for an resonator, and adapted to drive the resonator with the oscillation transistor based on the oscillation current from the current supply circuit, and a control section adapted to control the current supply circuit, wherein if the oscillation circuit is set to an overdrive mode, the oscillation circuit drives the resonator with higher drive power than drive power in a normal node.

According to this aspect of the invention, the resonator is driven by the oscillation transistor based on the oscillation current from the current supply circuit, and the oscillation operation of the resonator is performed. Then, if the overdrive mode is set, it results that the resonator is driven with higher drive power than the drive power in the normal mode. Therefore, it becomes possible to make efficient use of the circuit elements provided to the circuit device to realize the overdrive of the resonator.

In the aspect of the invention, the circuit device maybe configured such that the circuit device further includes a regulator supplied with a power supply voltage, and adapted to generate oscillation power supply voltage based on the power supply voltage, and the current supply circuit operates based on the oscillation power supply voltage from the regulator and supplies the oscillation circuit with the oscillation current in the normal mode, and operates based on the power supply voltage and supplies the oscillation circuit with the oscillation current in the overdrive mode.

By adopting the configuration described above, in the normal mode, the current supply circuit operates based on the oscillation power supply voltage, and then supplies the oscillation circuit with the oscillation current. Thus, the stable oscillation operation and so on can be realized. In contrast, in the overdrive mode, the current supply circuit operates based on the power supply voltage, and then supplies the oscillation circuit with the oscillation current. Therefore, it becomes possible to increase the drive power of the oscillation circuit in the overdrive mode, and thus it becomes possible to realize the effective overdrive.

In the aspect of the invention, the circuit device maybe configured such that the circuit device further includes a regulator supplied with a power supply voltage, and adapted to generate oscillation power supply voltage based on the power supply voltage, and the oscillation transistor of the oscillation circuit performs a transistor operation while being supplied with the oscillation current from the current supply circuit operating while being supplied with the oscillation power supply voltage in the normal mode, and performs a transistor operation while being supplied with the power supply voltage in the overdrive mode.

By adopting such a configuration, the oscillation current is supplied from the current supply circuit operating based on the oscillation power supply voltage and the oscillation transistor performs the transistor operation in the normal mode. In contrast, in the overdrive mode, the power supply voltage is supplied and the oscillation transistor performs the transistor operation. Therefore, since the oscillation transistor operates while being supplied with the power supply voltage in the overdrive mode, it becomes possible to increase the drive power of the oscillation circuit, and thus it becomes possible to realize the effective overdrive.

In the aspect of the invention, the circuit device may be configured such that the oscillation circuit includes the oscillation transistor of a bipolar type, and a feedback resistor disposed between a collector and a base of the oscillation transistor, the oscillation current from the current supply circuit is supplied to the collector of the oscillation transistor in the normal mode, and the power supply voltage is supplied to the collector of the oscillation transistor in the overdrive mode.

By adopting this configuration, in the overdrive mode, since it is arranged that the oscillation transistor of the bipolar type performs the transistor operation while the power supply voltage is supplied to the collector, it becomes possible to increase the drive power of the oscillation circuit.

In the aspect of the invention, the circuit device may be configured such that the oscillation transistor is composed of a plurality of transistors disposed in parallel to each other between a supply node of the oscillation current and a first power supply node, and the control section performs control of increasing the number of the transistors, which operate while being supplied with the oscillation current, in the overdrive mode compared to the normal mode.

By adopting this configuration, in the overdrive mode, since the number of transistors constituting the oscillation transistor is increased, it becomes possible to, for example, keep the drive power in the overdrive operation.

In the aspect of the invention, the circuit device maybe configured such that the circuit device further includes an overdriving drive circuit, and the oscillation circuit drives the resonator using the oscillation transistor in the normal mode, and drives the resonator using the overdriving drive circuit in the overdrive mode.

By adopting this configuration, in the overdrive mode, since the resonator can be driven by the overdriving drive circuit having higher drive power, it is possible to increase the absolute value of the negative resistance, for example, and thus, it becomes possible to realize the effective overdrive.

In the aspect of the invention, the circuit device may be configured such that the oscillation transistor is a bipolar transistor operating while the oscillation current supplied to the collector, and the overdriving drive circuit is an inverter circuit composed of a P-type MOS transistor and an N-type MOS transistor connected in series with each other.

By adopting this configuration, in the overdrive mode, it becomes possible to drive the resonator with the inverter circuit having higher drive power than that of the bipolar transistor.

In the aspect of the invention, the circuit device may be configured such that the oscillation circuit includes a variable capacitance circuit connected to at least either one of one end and the other end of the resonator, and the control section sets the capacitance value of the variable capacitance circuit to a smaller capacitance value in the overdrive mode compared to the normal mode.

By adopting this configuration, in the overdrive mode, since the variable capacitance circuit connected to at least one of the one end and the other end of the resonator is reduced, the load capacitance of the oscillation circuit is reduced. Thus, the absolute value of the negative resistance of the oscillation circuit can be increased, and it becomes possible to realize the effective overdrive.

In the aspect of the invention, the circuit device may be configured such that the variable capacitance circuit is one of a variable capacitance circuit for controlling an oscillation frequency and a variable capacitance circuit for temperature compensation of the oscillation frequency.

By adopting this configuration, it becomes possible to realize the effective overdrive effectively utilizing the variable capacitance circuit for controlling the oscillation frequency or for temperature compensation of the oscillation frequency.

In the aspect of the invention, the circuit device may be configured such that the oscillation circuit includes the oscillation transistor of a bipolar type, and a feedback resistor disposed between a collector and a base of the oscillation transistor, and having a variable resistance value, and the control section sets the resistance value of the feedback resistor to a smaller resistance value in the overdrive mode compared to the normal mode.

By adopting this configuration, in the overdrive mode, since the resistance value of the feedback resistor is reduced, the absolute value of the negative resistance of the oscillation circuit can be increased, and it becomes possible to realize the effective overdrive.

Another aspect of the invention relates to an oscillation device including any one of the circuit devices described above, and the resonator.

Still another aspect of the invention relates to an electronic apparatus including any one of the circuit devices described above.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Hereinafter, a preferred embodiment of the invention will be explained in detail. It should be noted that the present embodiment explained below does not unreasonably limit the content of the invention as set forth in the appended claims, and all of the constituents set forth in the present embodiment are not necessarily essential as means of the invention for solving the problems.

1. Overdrive

Figure 1:
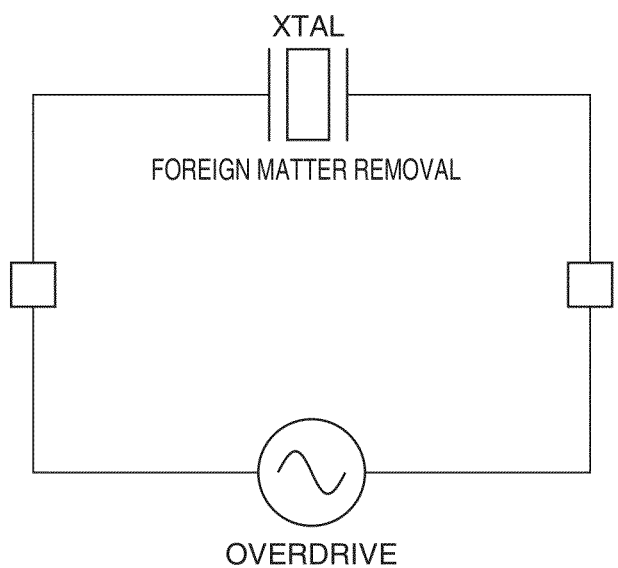
FIG. 1 is an explanatory diagram of an overdrive teat.

As described above, in the resonator such as the quartz crystal resonator, if the resonator is used in the state in which a foreign matter generated in the manufacturing process is attached to the resonator, there arise a problem, for example, that the oscillation frequency becomes unstable, and a problem that the oscillation frequency jumps. Therefore, as shown in FIG. 1, the overdrive test is performed on the resonator XTAL as a unit prior to installing the resonator XTAL in the oscillation device. Specifically, a high alternating current is made to flow through the resonator XTAL (e.g., a quartz crystal resonator) to vibrate it with a large amplitude to thereby remove the foreign matter adhering to the surface of the resonator XTAL.

However, depending on the package structure of the oscillation devices, there are some oscillation devices having a structure difficult to perform such an overdrive test on the unit resonator. Further, due to miniaturization of the oscillation device and so on, there is also a problem that it is becoming difficult to provide the overdriving electrodes.

Figure 2A:
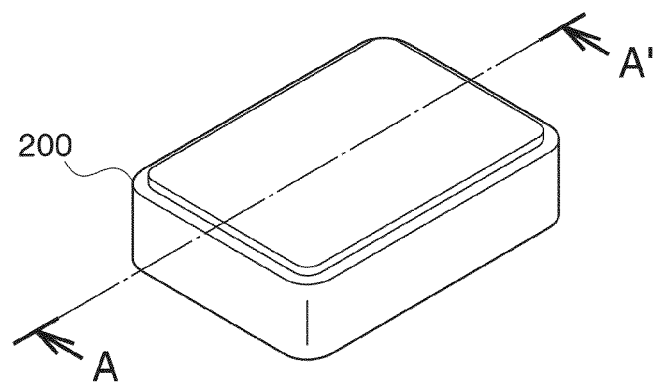
FIGS. 2A through 2C are diagrams showing an example of a package having a single seal structure.
Figure 2B:
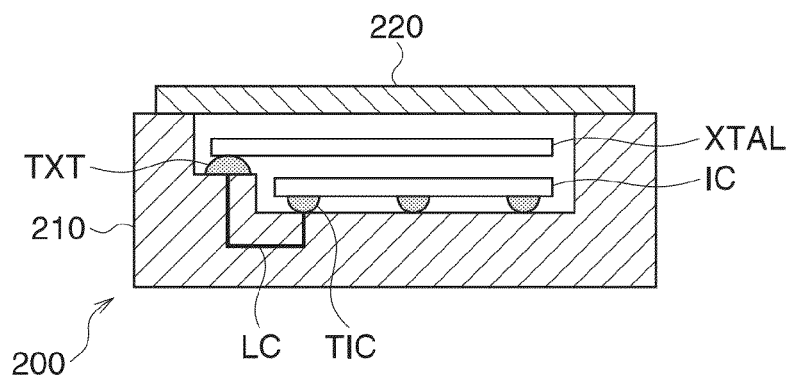
Figure 2C:
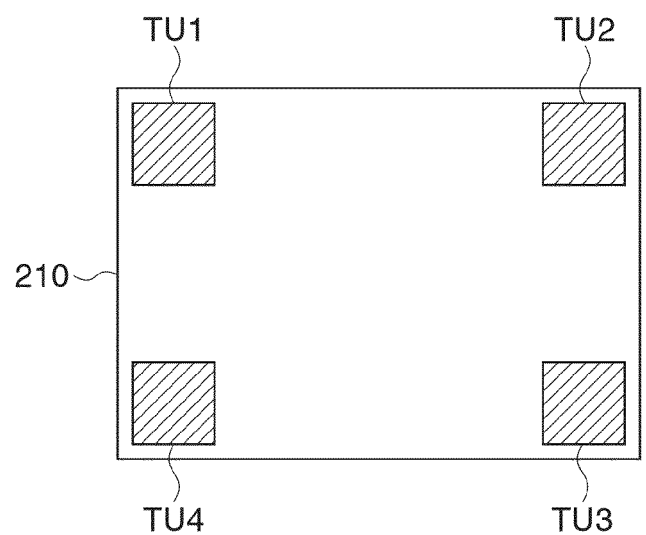

For example, FIGS. 2A through 2C show an example of the single seal structure as the package structure of the oscillation device 200 such as a quartz crystal oscillator. FIG. 2B is a cross-sectional view along the line A-A' shown in FIG. 2A.

The single seal structure is a package structure of installing the resonator XTAL (vibrator) and a circuit device IC in the same space in a package 210 of an oscillation device 200, and sealing them with a lid 220 (a lid section). For example, in FIG. 2B, the circuit device IC and the resonator XTAL are disposed in the space in the package 210, and an electrode TIC of the circuit device IC and an electrode TXT of the resonator XTAL are connected with a wiring line LC. Further, the resonator XTAL is mounted above the circuit device IC, and is sealed with the lid 220 disposed above the resonator XTAL.

Further, the control and so on of the oscillation device 200 is performed using user mount electrodes TU1 through TU4 (control electrodes of the oscillation device) formed on the bottom surface of the package 210 as shown in FIG. 2C. As the user mount electrodes TU1 through TU4, there can be cited, for example, frequency control electrode (VCON), power supply electrodes (VDD, VSS). In this case, it is possible to dispose the electrode TXT (terminal) of the resonator XTAL outside the oscillation device 200 as in the case of the user mount electrodes TU1 through TU4. However, since the electrode TXT is the electrode having an influence on the characteristics, the electrode is not generally disposed outside the oscillation device.

In the single seal structure, the circuit device IC is mounted, and then the resonator XTAL is mounted. Then, the circuit device IC and the resonator XTAL are connected to each other with the wiring line LC located inside the package 210. Therefore, there is a problem that it is unachievable to perform the characteristic confirmation by the resonator XTAL as a unit, and thus it is unachievable to perform the overdrive test by the resonator XTAL as a unit shown in FIG. 1. Therefore, there is a problem that the structure is inferior to other package structures from a viewpoint of quality or a yield ratio as a product.

Figure 3A:
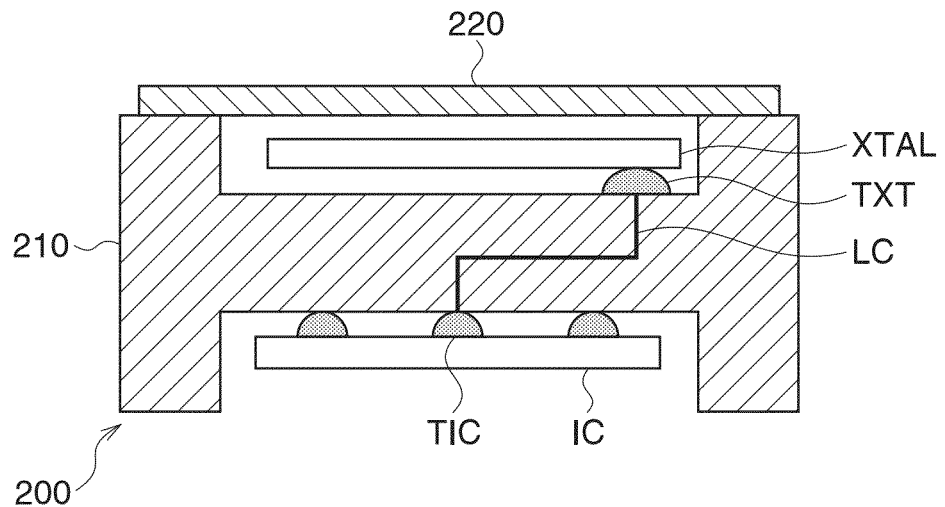
FIGS. 3A and 3B are diagrams showing an example of a package having an H-shape structure.
Figure 3B:
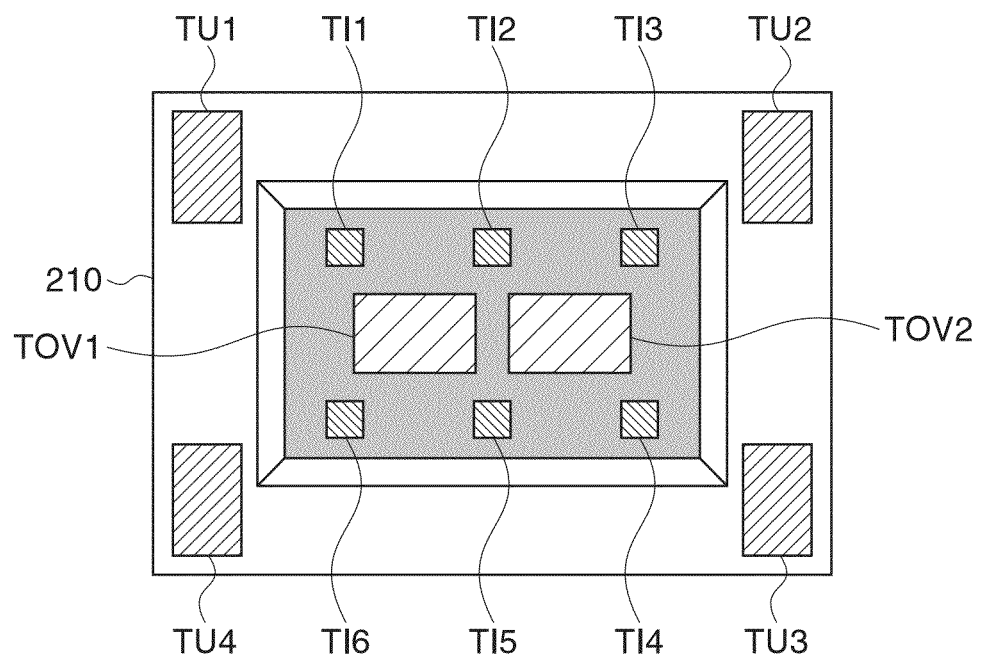

FIGS. 3A and 3B show an example of an H-shape structure as the package structure of the oscillation device 200. FIG. 3A is a cross-sectional view along the line A-A' shown in FIG. 2A.

In the H-shape structure, spaces called a cavity are disposed above and below the package 210, the circuit device IC is installed in the lower cavity to be mounted on a user substrate, and the resonator XTAL is installed in the upper cavity. Further, the electrode TIC of the circuit device IC and the electrode TXT of the resonator XTAL are connected to each other with the wiring line LC. Further, the cavity located on the resonator XTAL side is sealed with the lid 220. Assembling of the oscillation device 200 includes installation of the resonator XTAL and installation of the circuit device IC, and is performed in this order.

In the case of performing the overdrive in the H-shape structure, it is possible to previously dispose the electrode connected to the resonator XTAL to the cavity located on the side to which the circuit device IC is mounted, and then perform the overdrive test using this electrode. For example, in FIG. 3B, TU1 through TU4 denote the user mount electrodes, and TI1 through TI4 denote IC mount electrodes. Further, TOV1, TOV2 denote characteristic confirming electrodes of the resonator XTAL, and it is possible to perform the overdrive test by using these electrodes TOV1, TOV2. Specifically, after installing the resonator XTAL, and then sealing it with the lid 220, the overdrive test is performed using the electrodes TOV1, TOV2. Then, the circuit device IC is thereafter mounted to complete the oscillation device 200.

However, also in the H-shape structure, due to the miniaturization of the package and the miniaturization of the IC, it is becoming difficult to provide the overdriving electrodes (TOV1, TOV2). For example, the overdrive test needs to be performed while externally touching the overdriving electrodes with probes, and therefore, if the miniaturization of the package and so on progresses to reduce the size of the overdriving electrodes, the work for touching them with the probes becomes difficult. Therefore, it becomes unachievable to remove the foreign matter attached to the resonator, and thus, degradation of the reliability and the yield ratio might be incurred.

2. Configuration

Figures 4A, 4B:
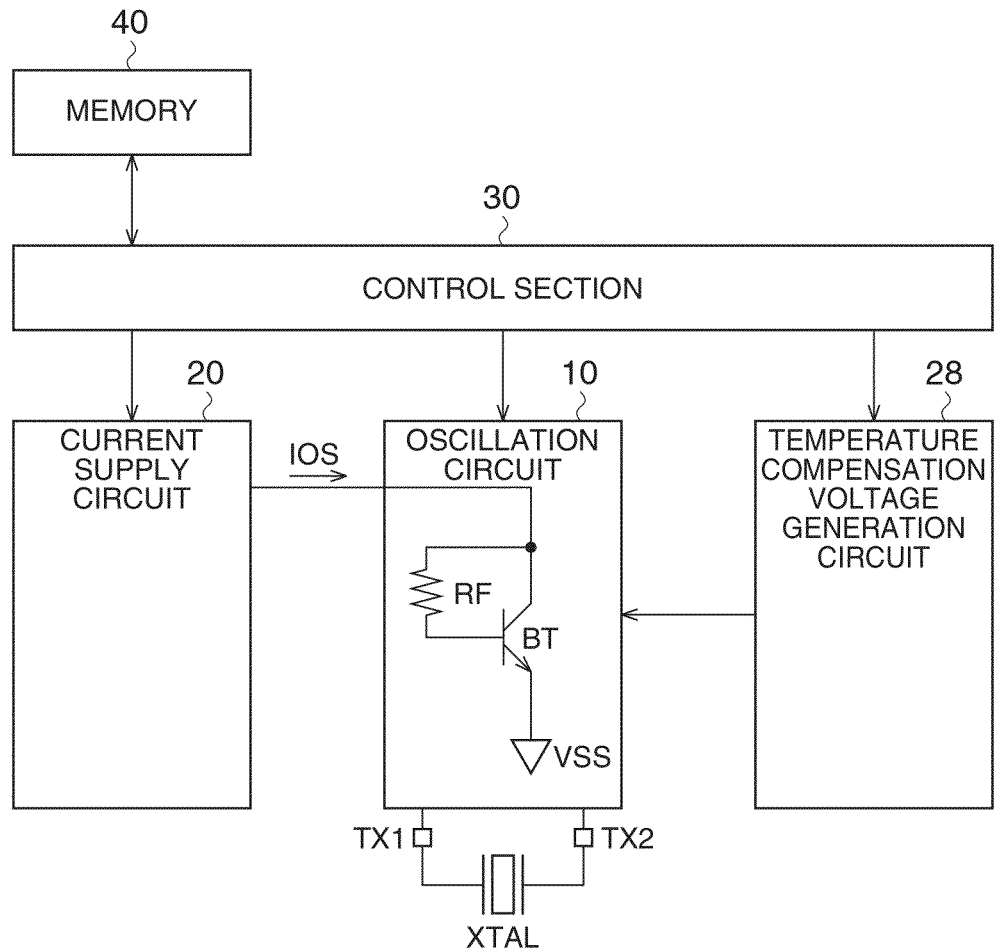
FIG. 4A is a diagram showing a configuration example of a circuit device and an oscillation device according to the present embodiment.
FIG. 4B is an explanatory diagram of a method according to the present embodiment.

FIG. 4A shows a configuration example of the circuit device and the oscillation device including the circuit device according to the present embodiment capable of solving the problem described above. The circuit device according to the present embodiment includes an oscillation circuit 10, a current supply circuit 20, and a control section 30. Further, the circuit device can include a temperature compensation voltage generation circuit 28 and a memory 40. It should be noted that the configuration of the circuit device according to the present embodiment is not limited to the configuration shown in FIG. 4A, but various practical modifications such as elimination/modification of some of the constituents (e.g., the temperature compensation voltage generation circuit) or addition of other constituents are possible.

Further, the oscillation device according to the present embodiment includes the circuit device composed of the oscillation circuit 10, the current supply circuit 20, and so on, and the resonator XTAL (vibrator, piezoelectric resonator, quartz crystal resonator). Specifically, by installing the circuit device and the resonator XTAL in the package as explained with reference to FIGS. 2A through 2C, 3A, and 3B, the oscillation device according to the present embodiment can be realized.

The oscillation circuit 10 is connected to the resonator XTAL (piezoelectric resonator, quartz crystal resonator). Specifically, the oscillation circuit 10 is connected to the resonator XTAL via first and second resonator terminals TX1, TX2 (electrodes, pads). The oscillation circuit 10 is a circuit for oscillating the resonator XTAL, which generates the inherent oscillation in response to application of a voltage, at a constant frequency.

The current supply circuit 20 (a constant current generation circuit) supplies the oscillation circuit 10 with a current. Specifically, the current supply circuit 20 supplies it with an oscillation current IOS (a bias current) or the like.

The temperature compensation voltage generation circuit 28 generates a temperature compensation voltage for realizing the TCXO, and then outputs it to the oscillation circuit 10. Thus, the temperature compensation of the oscillation frequency is realized.

The control section 30 performs control of, for example, the current supply circuit 20. Further, the control section 30 can perform control of the oscillation circuit 10, the temperature compensation voltage generation circuit 28, the memory 40, and so on. Further, the control section 30 performs interface processing with external devices, and so on. The control section 30 can be realized by a logic circuit such as standard cells or a gate array.

The memory 40 stores various information necessary for the operation of the circuit device. For example, the memory 40 stores information necessary for the current control of the current supply circuit 20, information necessary for the temperature compensation voltage generation circuit 28 to perform the temperature compensation process, and so on. The memory 40 can be realized by, for example, a nonvolatile memory. Alternatively, it is possible to realize the function of the memory 40 by a trimming circuit (a fuse circuit) or the like.

As described above, the circuit device according to the present embodiment includes the oscillation circuit 10, the current supply circuit 20, and the control section 30. Further, the current supply circuit 20 supplies the oscillation circuit 10 with the oscillation current IOS (the bias current). The oscillation circuit 10 has an oscillation transistor BT for the resonator XTAL. Further, the oscillation circuit 10 drives the resonator XTAL with the oscillation transistor BT based on the oscillation current IOS from the current supply circuit 20. Thus, the oscillation of the resonator XTAL is realized. Further, the control section 30 controls the current supply circuit 20. For example, the control section 30 controls the current value and so on of the oscillation current IOS supplied from the current supply circuit 20 to the oscillation circuit 10.

Further, in the present embodiment, if the oscillation circuit 10 is set to an overdrive mode, the oscillation circuit 10 drives the resonator XTAL with a higher drive power than the drive power in a normal mode (in a normal oscillation operation). Specifically, the oscillation circuit 10 drives the resonator XTAL with the drive current having a higher current value than the current value in the normal mode. For example, in the overdrive mode, the current value of the oscillation current IOS is set higher than in the normal mode. In other words, in the overdrive mode, it is arranged that the high current more than two times as high as that in the normal mode, for example, is made to flow.

Specifically, as shown in FIG. 4B, in the normal mode, the control section 30 controls the current supply circuit 20 so that the current supply circuit 20 supplies the oscillation current of IOS=INL. On the other hand, in the overdrive mode, the control section 30 controls the current supply circuit 20 so that the current supply circuit 20 supplies the oscillation current fulfilling IOS=IOV>INL. When performing the overdrive, the control section 30 controls the oscillation current IOS so that the resonator XTAL is driven with the power of several hundreds μW through several mW, for example. Thus, it becomes possible to drive the resonator XTAL with a higher drive power (a higher drive current) than in the normal mode. It should be noted that as described later, it is also possible to perform switching to a drive circuit for the overdrive in the overdrive mode to thereby drive the resonator XTAL with a higher drive power than in the normal mode.

For example, as is the case with Document 1 described above, some circuit devices for driving the resonator have a function of controlling the oscillation current flowing through the oscillation circuit. This is a function for coping with different oscillation frequencies, and is arranged to set the current value of the oscillation current to be higher when using the resonator with a high oscillation frequency to thereby make it possible to obtain a sufficient negative resistance.

Figure 5A:
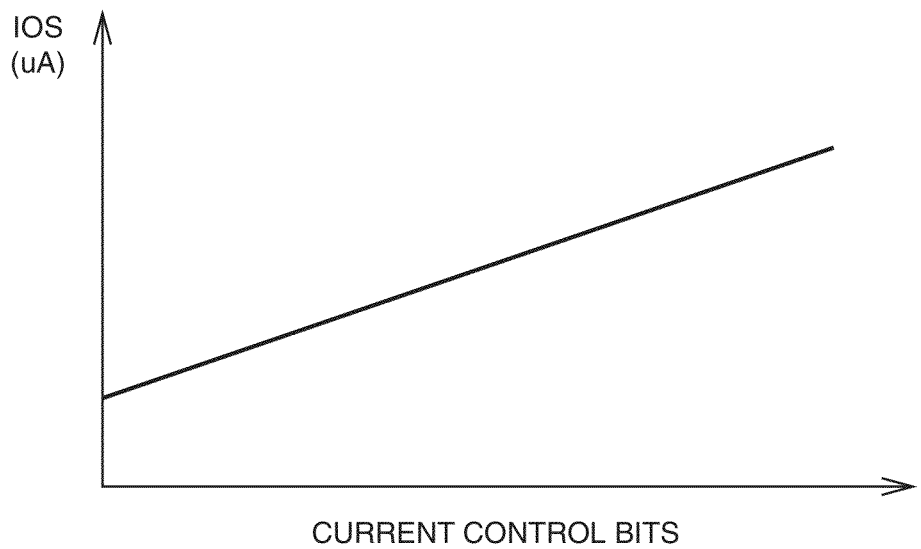
FIGS. 5A and 5B are diagrams respectively showing a relationship between a current adjustment bit and oscillation current, and a relationship between an oscillation frequency and the oscillation current.
Figure 5B:
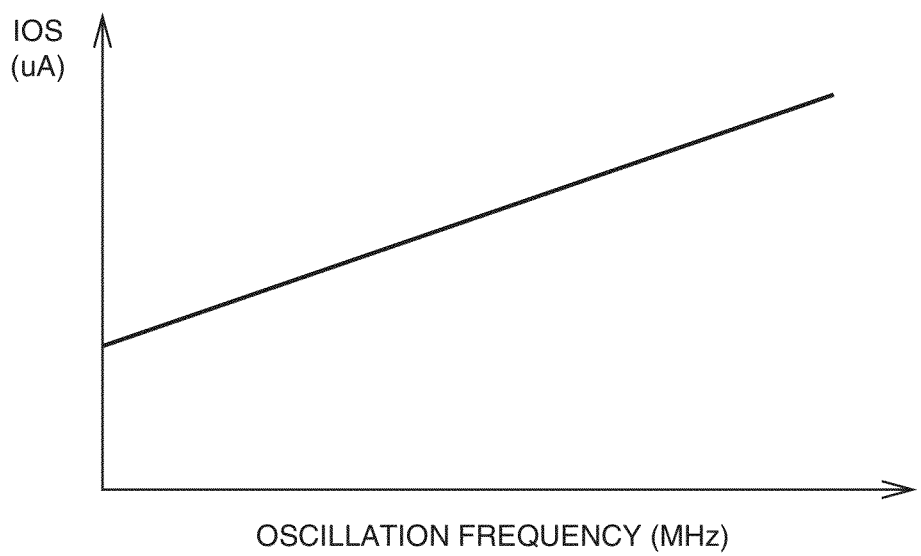

For example, as shown in FIG. 5A, the current value of the oscillation current IOS can be set by setting current control bits. The current control bits denote respective bits of the control signal output by the control section 30 (the memory 40) to the current supply circuit 20. Specifically, as shown in FIG. 5B, the current control bits of the control signal are controlled so that the higher the oscillation frequency of the resonator XTAL is, the higher the oscillation current IOS is. For example, the higher the current flowing through the oscillation transistor BT is, the larger the absolute value of the negative resistance of the oscillation circuit 10 becomes, and the higher the oscillation frequency is, the smaller the absolute value of the negative resistance becomes. Therefore, if the oscillation frequency rises, it becomes possible to keep the absolute value of the negative resistance to a high value by increasing the oscillation current IOS.

Further, in the present embodiment, focusing attention to such a current control function of the circuit device, the overdrive is realized by effectively utilizing the current control function. In other words, the overdrive is realized by providing the high current mode in which the high current exceeding the range used normally can be made to flow as the current supplied by the current supply circuit 20 (a constant current circuit).

Figure 6A:
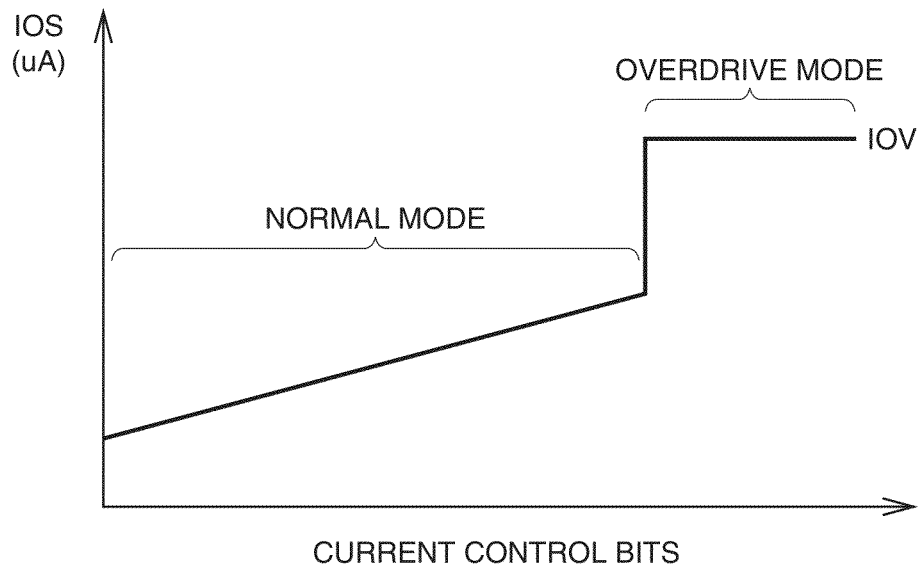
FIGS. 6A and 6B are explanatory diagrams of a method of controlling the oscillation current to realize the overdrive.

Specifically, as shown in FIG. 6A, in the normal mode (in the normal oscillation operation), the current value of the oscillation current IOS is controlled in accordance with the oscillation frequency using the current control bits.

Figure 6B:
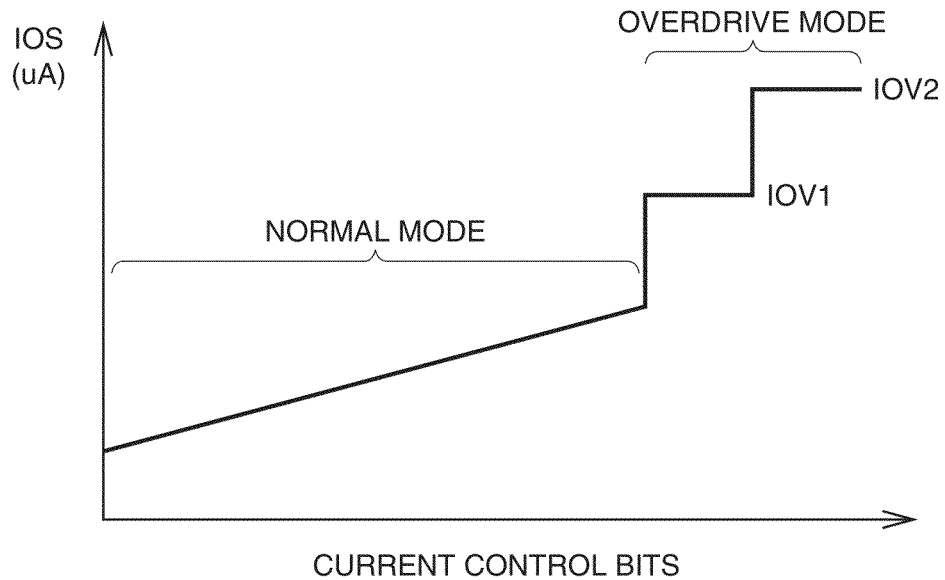

On the other hand, in the overdrive mode, the oscillation current IOS is set to the current IOV for the overdrive mode instead of such a current within the normal use range. Specifically, one of the current control bits, for example, is set to an overdrive bit (an enable bit of the overdrive), and the mode in which the current exceeding the normal use range can be made to flow is provided. For example, the overdrive bit is set to 0 in the normal mode on the one hand, and the overdrive bit is set to 1 in the overdrive mode on the other hand. By setting the overdrive bit to 1 as described above, the current supply circuit 20 shown in FIG. 4A is set to the state of supplying the high current IOV for the overdrive as the current IOS. Thus, the resonator XTAL becomes to be driven with high power, and thus it becomes possible to realize the overdrive test explained with reference to FIG. 1. It should be noted that it is also possible to set the overdrive current in multiple levels such as two levels (IOV1, IOV2) as shown in FIG. 6B. The current value of the overdrive is switched in accordance with, for example, the type (e.g., the size) of the resonator XTAL. Further, the resonator XTAL can also be a device (e.g., MEMS) other than the piezoelectric resonator.

Figure 7:
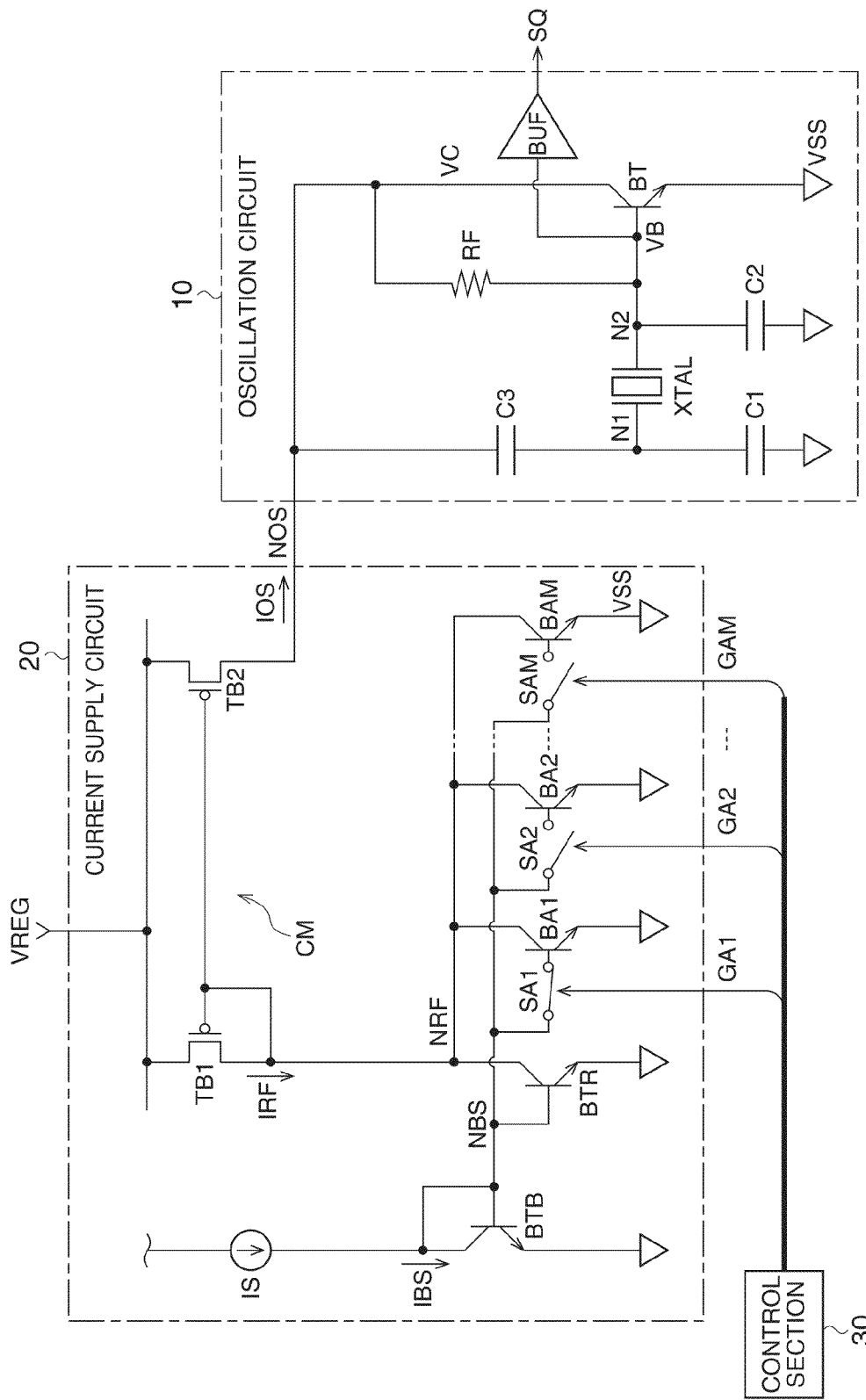
FIG. 7 is a diagram showing a detailed configuration example of the circuit device according to the present embodiment.

FIG. 7 shows a detailed configuration example of the circuit device of the present embodiment. It should be noted that the configuration of the circuit device according to the present embodiment is not limited to the configuration shown in FIG. 7, but various practical modifications such as elimination/modification of some of the constituents or addition of other constituents are possible.

As shown in FIG. 7, the oscillation circuit 10 includes first and second capacitors C1, C2. Further, the oscillation circuit 10 can include a third capacitor C3. One end of the first capacitor C1 is connected to one end (the first resonator terminal) of the resonator XTAL (the piezoelectric resonator). One end of the second capacitor C2 is connected to the other end (the second resonator terminal) of the resonator XTAL and the base of the oscillation transistor BT. One end of the third capacitor C3 is connected to the one end of the resonator XTAL.

Specifically, the capacitor C1 is disposed between a node N1 on one end side of the resonator XTAL and a VSS node (a first power supply node, a low-voltage side power supply node, in a broader sense). The capacitor C2 is disposed between a node N2 on the other end side of the resonator XTAL and the VSS node. The node N2 is connected to the base of the oscillation transistor BT. The capacitor C3 is disposed between a supply node NOS of the current IOS and the node N1.

The oscillation transistor BT is a grounded-emitter bipolar transistor, and has the collector connected to the supply node NOS of the current IOS (the bias current), and the emitter connected to the VSS node. Further, the base is connected to the node N2, and thus the voltage VB of the node N2 is input to a buffer circuit BUF, and then output as an output signal SQ (oscillation clock signal) of the oscillation circuit 10.

A feedback resistor RF is disposed between the collector and the base of the oscillation transistor BT. It results that the base current branched from the current IOS from the current supply circuit 20 is supplied to the base of the oscillation transistor BT via the feedback resistor RF.

The current supply circuit 20 includes a current mirror circuit CM for supplying the current IOS. The current mirror circuit CM includes a reference current transistor TB1 and a current supply transistor TB2. These transistors TB1, TB2 are, for example, P-type MOS transistors.

A reference current IRF flows through the reference current transistor TB1. The reference current transistor TB1 is disposed between a node of a power supply voltage VREG (an oscillation power supply voltage in a broad sense) and a node NRF, and the gate and the drain thereof are connected to each other. The power supply voltage VREG is a voltage obtained by regulating (stepping down) a high-voltage side power supply voltage VCC with a regulator (a constant voltage source) described later.

The current supply transistor TB2 has the gate connected to the gate and the drain of the reference current transistor TB1, and supplies the current IOS. The current supply transistor TB2 is disposed between the node of the power supply voltage VREG and the supply node NOS of the current IOS.

The reference current IRF is generated by bipolar reference current generation transistors BTR, and BA1 through BAM. Specifically, a reference bias current IBS from a current source IS flows through a bipolar transistor BTB for the reference bias current. Further, the transistor BTB and the transistors BTR, BA1 through BAM constitute a current mirror circuit, and thus it results that the current corresponding to the reference bias current IBS flows through the reference current transistor TB1 as the reference current IRF.

On this occasion, the current supply circuit 20 variably controls the current value of the reference current IRF based on control signals GA1 through GAM (first through M-th control signals; M denotes an integer equal to or greater than 2) from the control section 30. Specifically, between the node NBS to which the base of the transistor BTR is connected and the base terminals of the transistors BA1 through BAM (first through M-th bipolar transistors), there are disposed switch elements SA1 through SAM (first through M-th switch elements), respectively. These switch elements SA1 through SAM are ON/OFF controlled by the control signals GA1 through GAM (the first through M-th control signals) from the control section 30, and thus it becomes possible to variably control the current value of the reference current IRF.

For example, if the switch element SA1 is set to the ON state, and the other switch elements SA2 through SAM are set to the OFF state, it results that the current, which is obtained by adding a current flowing through the transistor BA1 to a default current flowing through the transistor BTR, flows through the transistor TB1 as the reference current IRF. Further, it results that the current corresponding to the current value of the reference current IRF and the size ratio (W/L ratio) between the transistors TB1, TB2 is supplied as the current IOS.

Further, the current control shown in FIGS. 6A and 6B can be realized by the current control bits of the control signals GA1 through GAM. For example, in the normal mode, the current value of the current IOS is controlled in accordance with the oscillation frequency using the control signals GA1 through GAM. On the other hand, in the overdrive mode, the current value of the current IOS is controlled so that the current IOV for the overdrive flows using the control signals GA1 through GAM. For example, one or more of the transistors BA1 through BAM are assigned as overdriving transistors. Then, in the normal mode, the overdriving transistor is set to the OFF state using the corresponding switch element. In contrast, in the overdrive mode, the overdriving transistor is set to the ON state. Then, by arranging that the reference current IRF with a large current value flows if the overdriving transistor is set to the ON state, it becomes possible to make the high current for the overdrive flow through the oscillation transistor BT.

According to the circuit device of the present embodiment described above, it is possible to realize the overdrive for removing the foreign matter of the resonator effectively utilizing the circuit element (the current control function) provided to the circuit device. In other words, although the overdrive test can previously be realized only by the unit resonator, according to the present embodiment, it becomes possible to realize the overdrive even after integrating the resonator and the circuit device with each other in a package, for example. Therefore, as shown in, for example, FIGS. 2A through 2C, even in the oscillation device having the package structure difficult to perform the overdrive teat by the resonator as a unit, it becomes possible to realize the overdrive after installing the resonator and the circuit device in the package. Further, in the package structure as shown in FIGS. 3A and 3B, for example, even in the case in which the area for forming the overdriving electrodes is eliminated due to the miniaturization of the oscillation device and so on, it becomes possible to realize the overdrive after installing the resonator and the circuit device in the package. Thus, it becomes possible to remove the foreign matter or the like attached to the resonator, and thus it becomes possible to keep the stable quality.

It should be noted that the setting of the overdrive mode and so on can be realized using the user mount electrodes TU1 through TU4 (external terminals of the oscillation device) shown in FIGS. 2C and 3B. Specifically, by inputting predetermined signals to the user mount electrodes TU1 through TU4 in a predetermined sequence, access to a register of the circuit device (IC) is achieved. Further, due to the access to the register, the overdrive bit of the current control bits described above is set to, for example, 1 to thereby set the operation mode of the circuit device to the overdrive mode. Then, as explained with reference to FIG. 7, the control section 30 performs the ON/OFF control of the switch elements SA1 through SAM using the control signals GA1 through GAM, and thus, the current supply circuit 20 supplies the oscillation circuit with the current IOV for the overdrive mode as the oscillation current IOS. Thus, it becomes possible for the oscillation circuit 10 to drive the resonator XTAL with higher drive power than in the normal mode, and it becomes possible to realize the overdrive explained with reference to FIGS. 6A and 6B.

3. Modified Examples

Then, various modified examples (application examples) of the present embodiment will be explained. For example, there can be the case in which the drive current necessary for the overdrive is not sufficiently obtained only by the control of the oscillation current described above. However, according to the modified example explained hereinafter, this can be resolved. It should be noted that hereinafter only the configuration of the characteristic part is described in each of the modified examples for the sake of simplification of the explanation, and the explanation will be presented while appropriately omitting the detailed constituents explained with reference to FIGS. 4A, 7, and so on. The configuration obtained by combining the configuration shown in FIGS. 4A, 7, and so on and any one of the modified examples explained hereinafter, and the combinations of the modified examples are also included in the scope of the invention.

Figures 8, 9:
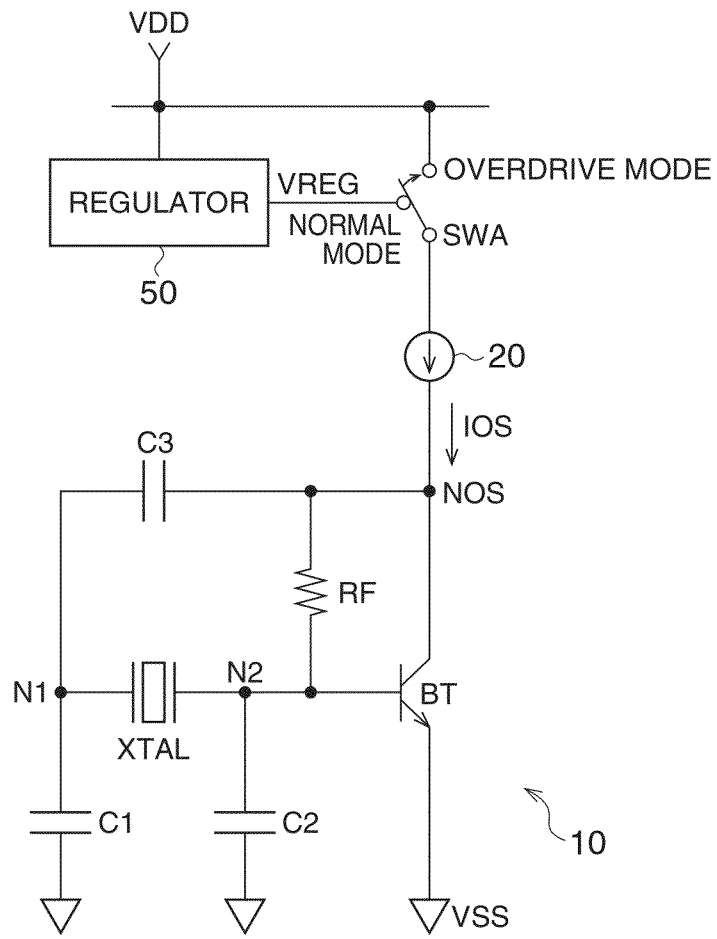
FIG. 8 is a diagram showing a first modified example of the circuit device according to the present embodiment.
FIG. 9 is an explanatory diagram of an operation of the first modified example.

FIG. 8 is a diagram showing a first modified example of the circuit device according to the present embodiment. In the first modified example, if the overdrive mode is set, the operation power supply voltage of the current supply circuit 20 is switched from the oscillation power supply voltage VREG to the power supply voltage VDD.

Specifically, in the first modified example shown in FIG. 8, the circuit device includes a regulator 50. The regulator 50 is supplied with the power supply voltage VDD, and generates an oscillation power supply voltage VREG (a regulator voltage) based on the power supply voltage VDD. The regulator 50 is a constant voltage generation circuit, and supplies the current supply circuit 20 with the voltage VREG obtained by stepping down the power supply voltage VDD as the oscillation power supply voltage. The regulator 50 can be realized with, for example, resistors for voltage dividing the output voltage (VREG), and a differential amplifier circuit (a comparator) having a non-inverting input terminal to which the voltage from the voltage division node formed of the resistors is input and an inverting input terminal to which the reference voltage is input.

Further, in the normal mode, the current supply circuit 20 operates based on the oscillation power supply voltage VREG (the voltage obtained by stepping down the VDD) from the regulator 50 to supply the oscillation circuit 10 with the oscillation current IOS. On the other hand, in the overdrive mode, the current supply circuit 20 operates based on the power supply voltage VDD to supply the oscillation circuit 10 with the oscillation current IOS (the overdrive current IOV). In other words, as shown in FIG. 9, the power supply voltage of the current supply circuit 20, which is VREG supplied from the regulator 50 in the normal mode, is switched from VREG (e.g., 1.5 V) to VDD (e.g., 3 V) in the overdrive mode. The switching of the power supply voltage can be realized by a switch element SWA shown in FIG. 8. Specifically, one end of the switch element SWA is connected to the power supply node of the current supply circuit 20, and the control section 30 switches the other end of the switch element SWA to the regulator 50 side in the normal mode, or to the power supply voltage VDD side in the overdrive mode.

In order to achieve the stable oscillation operation, it is necessary to keep the power supply voltage stable. Therefore, in FIG. 8, the power supply voltage VREG, which is generated from the power supply voltage VDD, and is a constant voltage, is supplied to the current supply circuit 20 in the normal mode. According to this configuration, even in the case in which, for example, there is a fluctuation in the power supply voltage VDD (an external power supply voltage), the influence of the fluctuation in the power supply voltage is resolved, and it becomes possible to supply the stable oscillation current IOS. Thus, it becomes possible to realize the stable oscillation operation to thereby achieve the stabilization of the circuit performance such as the oscillation frequency.

In contrast, the overdrive mode is provided for removing the foreign matter or the like of the resonator XTAL, and it is not so much required to consider the stabilization of the circuit performance.

Therefore, in FIG. 8, the constant voltage VREG is supplied as the power supply voltage of the current supply circuit 20 to achieve the stabilization of the circuit characteristic in the normal mode on the one hand, and the power supply voltage VDD with the higher potential than VREG is supplied in the overdrive mode on the other hand. By setting the power supply voltage of the current supply circuit 20 to the voltage VDD higher than VREG in the overdrive mode, the performance of the current supply circuit 20 is improved, and the drive of the resonator XTAL with the higher drive power than in the normal mode becomes possible. Thus, it becomes possible to realize the more effective overdrive. Therefore, it becomes possible to remove the foreign matter or the like attached to the resonator XTAL to thereby keep the stable quality.

Figure 10:
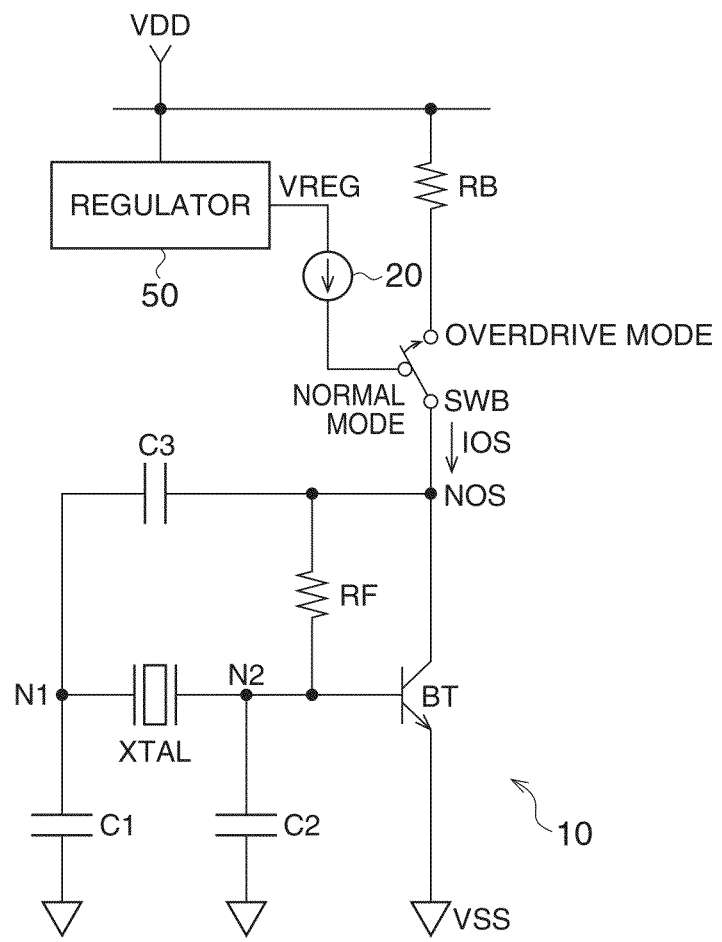
FIG. 10 is a second modified example of the circuit device according to the present embodiment.

FIG. 10 is a diagram showing a second modified example of the present embodiment. In the second modified example, if the overdrive mode is set, switching to the direct drive with the power supply voltage VDD is performed to thereby increase the drive power of the oscillation circuit 10.

Specifically, in the second modified example shown in FIG. 10, the circuit device includes the regulator 50 similarly to the first modified example shown in FIG. 8. The regulator 50 is supplied with the power supply voltage VDD, and generates the oscillation power supply voltage VREG based on the power supply voltage VDD. Further, in the normal mode, the oscillation transistor BT of the oscillation circuit 10 is supplied with the oscillation current IOS from the current supply circuit 20, which operates while being supplied with the oscillation power supply voltage VREG, and performs the transistor operation. In contrast, in the overdrive mode, the oscillation transistor BT is supplied with the power supply voltage VDD, and performs the transistor operation. The power supply voltage VDD is supplied to the oscillation transistor BT via, for example, a resistor RB. In other words, switching from the transistor operation due to the current drive by the current supply circuit 20 to the transistor operation due to the direct drive with the power supply voltage VDD is performed. The switching can be realized by a switch element SWB shown in FIG. 10. Specifically, one end of the switch element SWB is connected to the collector of the oscillation transistor BT, and the control section 30 switches the other end of the switch element SWB to the current supply circuit 20 side in the normal mode, or to the power supply voltage VDD side (the resistor RB side) in the overdrive mode.

More specifically, the oscillation circuit 10 includes the bipolar oscillation transistor BT and a feedback resistor RF disposed between the collector and the base of the oscillation transistor BT.

Further, in the normal mode, the oscillation current IOS from the current supply circuit 20 is supplied to the collector of the oscillation transistor BT. Specifically, by switching the other end of the switch element SWB to the current supply circuit 20 side, it results that the oscillation current IOS is supplied to the collector of the oscillation transistor BT. It should be noted that the oscillation current IOS is partially supplied to the base of the oscillation transistor BT via the feedback resistor RF.

In contrast, in the overdrive mode, the power supply voltage VDD is supplied to the collector of the oscillation transistor BT. Specifically, the power supply voltage VDD is supplied to the collector of the oscillation transistor BT via the resistor RB.

By adopting the above configuration, it becomes that in the overdrive mode the oscillation transistor BT operates by the direct drive with the power supply voltage VDD. Therefore, it becomes possible for the oscillation transistor BT to drive the resonator XTAL with higher drive power compared to the normal mode in which the oscillation transistor BT operates in the current drive mode, and thus it becomes possible to realize the effective overdrive. Thus, it becomes possible to remove the foreign matter or the like attached to the resonator XTAL to thereby keep the stable quality.

Figure 11:
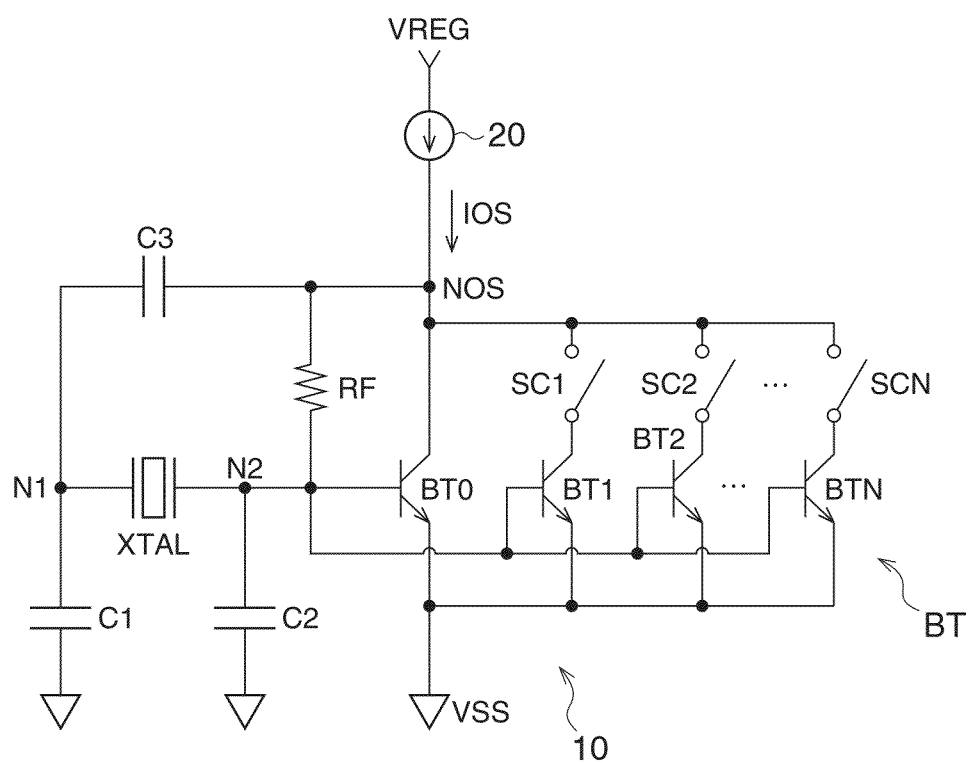
FIG. 11 is a third modified example of the circuit device according to the present embodiment.

FIG. 11 is a diagram showing a third modified example of the present embodiment. In the third modified example, if the overdrive mode is set, the size of the oscillation transistor BT is increased in conjunction therewith to thereby increase the drive power of the oscillation circuit 10.

Specifically, as shown in FIG. 11, the oscillation transistor BT is composed of a plurality of transistors BT0 through BTN disposed in parallel with each other between the supply node NOS (a collector node) of the oscillation current IOS and the VSS node (the first power supply node in a broad sense). Further, in the overdrive mode, the control section 30 performs the control of increasing the number of the transistors (BT0 through BTN), which are supplied with the oscillation current IOS and thus operate, compared to the normal mode.

For example, the base of each of the transistors BT1 through BTN is connected to a node N2 of the base of the transistor BT0. The node N2 is a node to be connected to one ends of the capacitor C2 and the feedback resistor RF. Further, between the collectors of the transistors BT1 through BTN and the node NOS, there are disposed switch elements SC1 through SCN, respectively. These switch elements SC1 through SCN are ON/OFF controlled with control signals from the control section 30. Thus, it becomes possible to control the number of the transistors which are supplied with the oscillation current IOS in the respective collectors, and thus operate.

As an example, in the normal mode, the switch elements SC1 through SCN are set to the OFF state. Thus, it results that the transistor BT0 is set as the drive transistor of the oscillation circuit 10 to drive the resonator XTAL.

In contrast, in the overdrive mode, the switch elements SC1 through SCN are set to the ON state. According to this process, it results that the collectors of the transistors BT1 through BTN are also supplied with the oscillation current IOS, and the transistors BT1 through BTN are also set as the drive transistor in addition to the transistor BT0 to drive the resonator XTAL. In other words, if the overdrive mode is set, the number of transistors supplied with the oscillation current IOS and thus operating is increased from 1 to N+1.

According to the third modified example shown in FIG. 11, it becomes possible to reduce the current flowing through each of the transistors, and thus, the load of the transistor as a device can be reduced to thereby suppress the stress. Further, if a high current is made to flow through one transistor, the performance is degraded, and thus, it might be unachievable to realize the desired overdrive. In this regard, according to the method of constituting the oscillation transistor BT with a plurality of transistors BT0 through BTN as shown in FIG. 11, it becomes possible to keep the desired performance by distributing the load and the stress.

Figure 12:
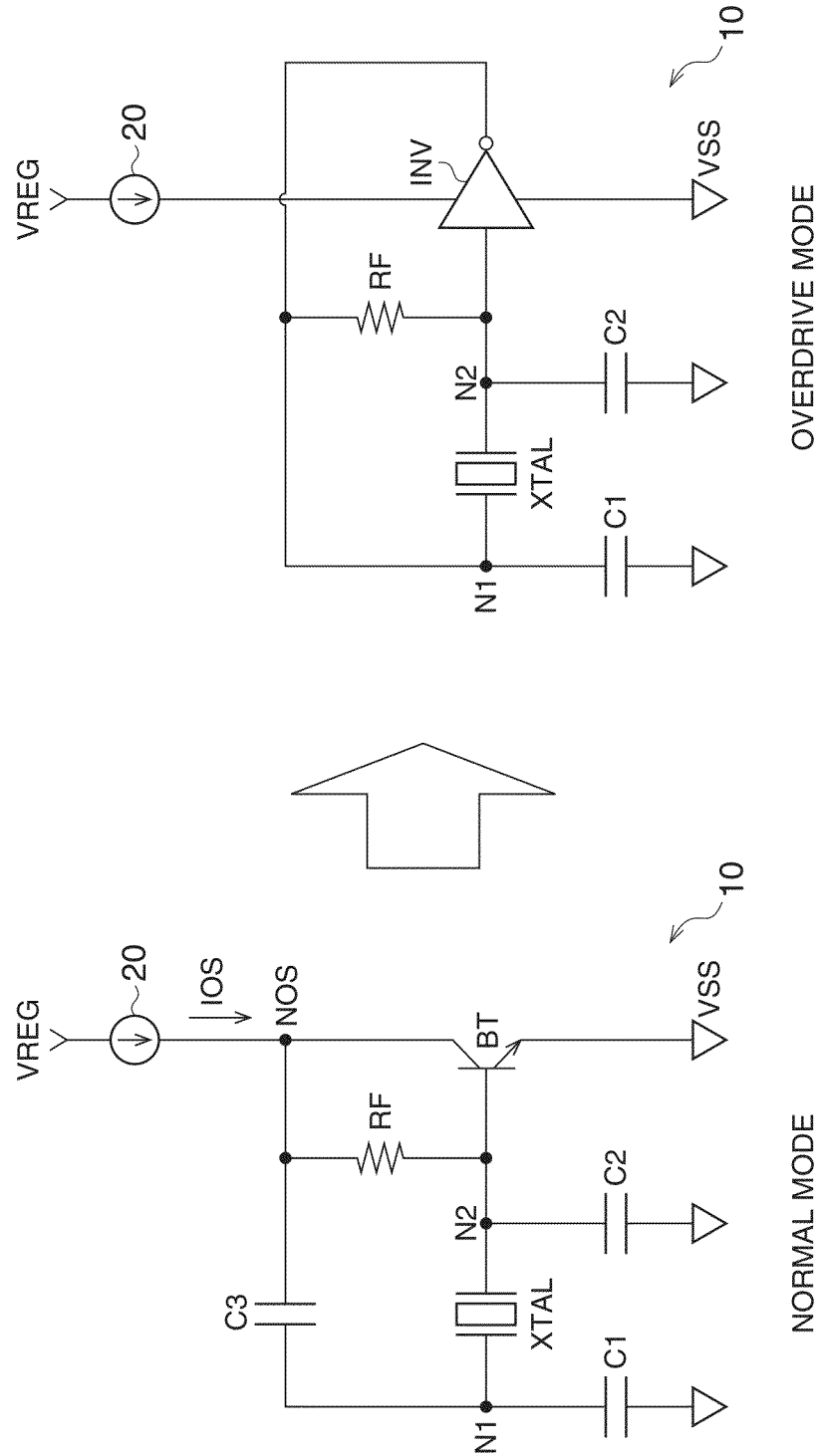
FIG. 12 is a fourth modified example of the circuit device according to the present embodiment.

FIG. 12 is a diagram showing a fourth modified example of the present embodiment. In the fourth modified example, there is adopted a circuit configuration in which switching to a circuit with higher drive power is performed in conjunction with setting of the overdrive mode to thereby make the overdrive work preferably. Specifically, in the fourth modified example, the circuit device includes an overdriving drive circuit. In FIG. 12, an inverter circuit INV corresponds to the overdriving drive circuit. Further, the oscillation circuit 10 drives the resonator XTAL using the oscillation transistor BT in the normal mode, and drives the resonator XTAL using the inverter circuit INV as the overdriving drive circuit in the overdrive mode.

Specifically, in FIG. 12, the oscillation transistor BT is a bipolar transistor supplied with the oscillation current IOS in the collector, and thus operating. On the other hand, the overdriving drive circuit is the inverter circuit INV composed of a P-type MOS transistor and an N-type MOS transistor connected in series with each other.

Further, the resonator XTAL is driven by the bipolar oscillation transistor BT in the normal mode. By using such a bipolar oscillation transistor BT, a harmful influence of the noise can be reduced. In contrast, when the overdrive mode is set, the resonator XTAL is driven by the inverter circuit INV as the overdriving drive circuit instead of the oscillation transistor BT. Thus, it becomes possible to drive the resonator XTAL with higher drive power in the case in which the overdrive mode is set than in the normal mode. Further, by driving the resonator XTAL with the inverter circuit INV in the overdrive mode, it becomes possible to, for example, increase the absolute value of the negative resistance, and it becomes possible to effectively realize the overdrive with the high current.

Figure 13:
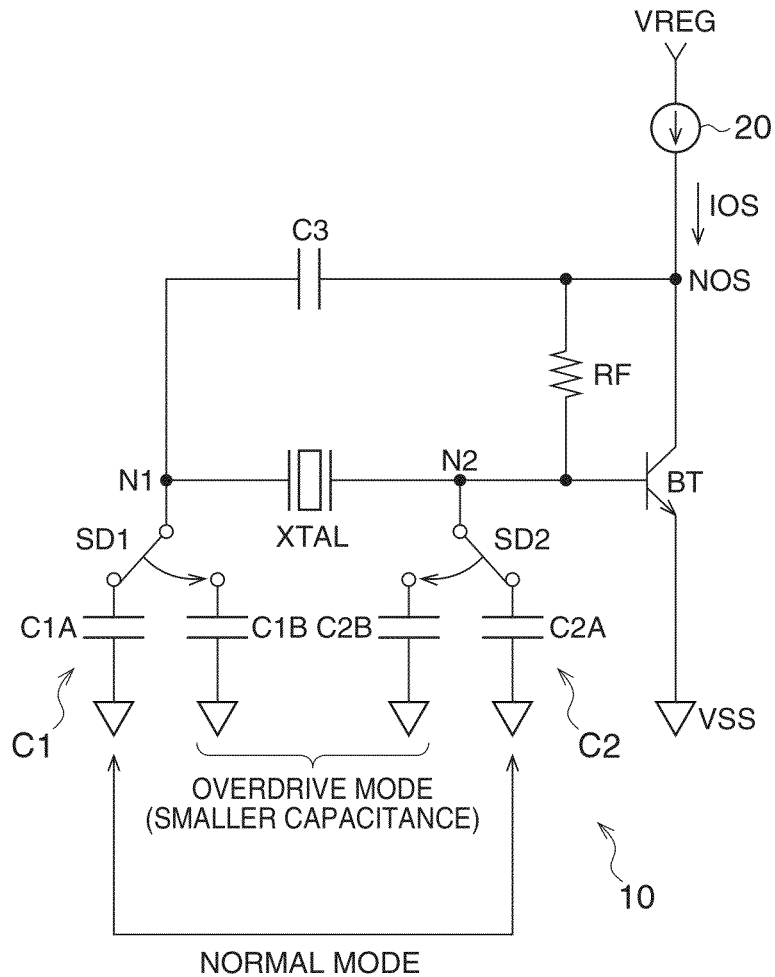
FIG. 13 is a fifth modified example of the circuit device according to the present embodiment.

FIG. 13 is a diagram showing a fifth modified example of the present embodiment. In the fifth modified example, if the overdrive mode is set, the load capacitance of the oscillation circuit 10 is switched to a smaller capacitance in conjunction with setting of the overdrive mode. The load capacitance is a combined capacitance viewed from the both ends of the resonator XTAL. Specifically, in the fifth modified example, the oscillation circuit 10 includes the variable capacitance circuits (C1, C2) connected to at least one end and the other end of the resonator XTAL, and the control section 30 sets the capacitance value of the variable capacitance circuit to a smaller capacitance value in the overdrive mode compared to that in the normal mode.

For example, in FIG. 13, the first and second capacitors C1, C2 are each formed as a variable capacitance circuit, and arranged so that the capacitance value is variably switched. Specifically, the variable capacitance circuit C1 (the capacitor C1) includes a capacitor C1A, a capacitor C1B having a smaller capacitance value than the capacitor C1A, and a switch element SD1. Further, the variable capacitance circuit C2 (the capacitor C2) includes a capacitor C2A, a capacitor C2B having a smaller capacitance value than the capacitor C2A, and a switch element SD2. The switch elements SD1, SD2 are ON/OFF controlled based on control signals from the control section 30.

Further, one end of the switch element SD1 is connected to one end of the resonator XTAL, and in the normal mode, the other end of the switch element SD1 is connected to the capacitor C1A. Similarly, one end of the switch element SD2 is connected to the other end of the resonator XTAL, and in the normal mode, the other end of the switch element SD2 is connected to the capacitor C2A.

In contrast, in the overdrive mode, the other end of the switch element SD1 is connected to the capacitor C1B having a smaller capacitance value than the capacitor C1A. Similarly, in the overdrive mode, the other end of the switch element SD2 is connected to the capacitor C2B having a smaller capacitance value than the capacitor C2A. As described above, in the overdrive mode, the capacitance values of the variable capacitance circuits C1, C2 are set to smaller capacitance values compared to the normal mode. In other words, the load capacitance as the combined capacitance viewed from the both ends of the resonator XTAL is set to a smaller capacitance value in the overdrive mode.

If the load capacitance is set to a smaller value as described above, the absolute value of the negative resistance is increased, and it becomes possible to make a higher drive current flow, and thus, the effectiveness of the overdrive can be enhanced.

In other words, the smaller the load capacitance becomes, the larger the negative resistance in the oscillation circuit 10 becomes. Therefore, in the overdrive mode, by setting the load capacitance to a smaller value, the absolute value of the negative resistance is increased, and thus, it becomes possible to drive the resonator XTAL with a higher drive current.

For example, in the normal mode, the load capacitance is never set to an extremely small capacitance value taking the stability of the oscillation circuit 10 into consideration. In this regard, since the overdrive is performed for making a higher current flow through the resonator XTAL, even if the load capacitance is set to such a small capacitance value, there arises no problem, and it becomes possible to realize effective elimination of the foreign matter due to the overdrive.

It should be noted that as the variable capacitance circuits C1, C2, a variable capacitance circuit for oscillation frequency control, and a variable capacitance circuit for temperature compensation of the oscillation frequency can be used. For example, in the oscillation circuit 10, it is preferable that when the oscillation frequency changes, the capacitance values of the variable capacitance circuits C1, C2 are changed in accordance therewith. Specifically, setting of the capacitance value corresponding to the oscillation frequency becomes possible by providing a capacitor array, and then changing the capacitance value of the capacitor array. On this occasion, the variable capacitance circuits C1, C2 can be realized by effectively utilizing such a capacitor array. Alternatively, in the case of realizing the temperature compensation of the oscillation frequency due to the temperature compensation voltage generation circuit 28 shown in FIG. 4A, a varactor having a capacitance value controlled by a voltage is used. On this occasion, the variable capacitance circuits C1, C2 can be realized by effectively utilizing the varactor for temperature compensation.

Figure 14:
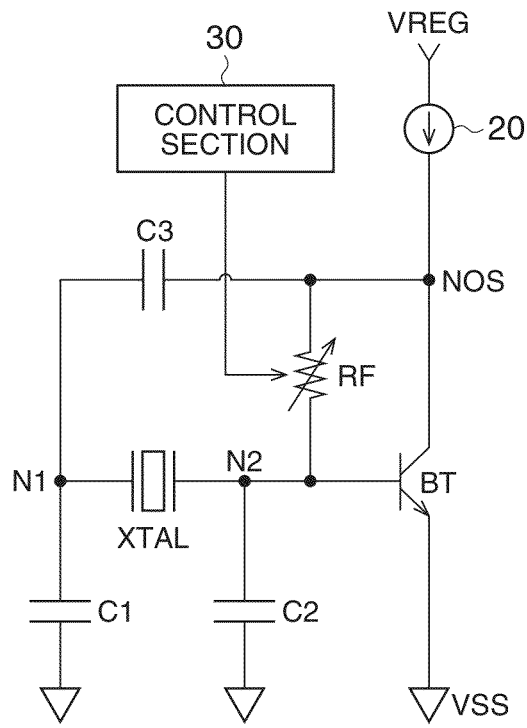
FIG. 14 is a sixth modified example of the circuit device according to the present embodiment.

FIG. 14 is a diagram showing a sixth modified example of the present embodiment. In the sixth modified example, if the overdrive mode is set, the resistance value of the feedback resistor RF is switched in conjunction with setting of the overdrive mode.

Specifically, as shown in FIG. 14, the oscillation circuit 10 includes the bipolar oscillation transistor BT and the feedback resistor RF having a variable resistance value and disposed between the collector and the base of the oscillation transistor BT. Further, in the overdrive mode, the control section 30 sets the resistance value of the feedback resistor RF to a smaller resistance value compared to the normal mode.

By setting the resistance value of the feedback resistor RF to a smaller value as described above in the overdrive mode, the absolute value of the negative resistance of the oscillation circuit 10 is increased, and thus, it becomes possible to drive the resonator XTAL with a higher drive current.

Further, in the normal mode, by controlling the value of the feedback resistor RF disposed between the collector and the base so that the voltage difference between the collector voltage of the oscillation transistor BT and the power supply voltage can be assured in accordance with the collector current, the stable oscillation condition can be obtained. Therefore, according to the sixth modified example shown in FIG. 14, there is an advantage that it is possible to effectively utilize the variable control function of the resistance value of the feedback resistor RF used in such a normal mode to realization of the overdrive mode. It should be noted that in order to suppress rise in the collector voltage, it is also possible to arrange that the base current (an auxiliary base current) is supplied to the base of the oscillation transistor BT from, for example, the current supply circuit 20 via a path different from the supply path of the current IOS.

4. Electronic Apparatus

Figure 15:
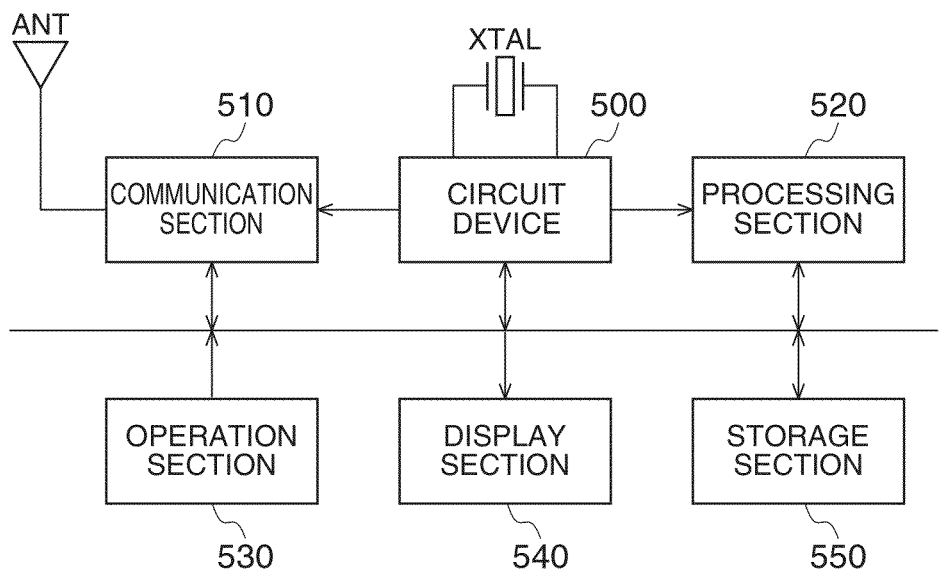
FIG. 15 is a configuration example of an electronic apparatus according to the present embodiment.

FIG. 15 shows a configuration example of an electronic apparatus including the circuit device according to the present embodiment. The electronic apparatus includes the circuit device 500 according to the present embodiment, the resonator XTAL such as a quartz crystal resonator, an antenna ATN, a communication section 510, and a processing section 520. Further, the electronic apparatus can include an operation section 530, a display section 540, and a storage section 550. It should be noted that various modified implementations such as elimination of some constituents or addition of other constituents are also possible.

As the electronic apparatus shown in FIG. 15, there can be assumed various apparatuses such as a portable information terminal (a cellular phone, a smartphone), a bioinstrumentation apparatus (e.g., a pulse meter and a pedometer), a video apparatus (a digital camera, a video camera).

The communication section 510 (a wireless circuit) performs a process of receiving data externally via the antenna ANT and transmitting data to the outside. The processing section 520 performs a control process of the electronic apparatus, a variety of digital processes of the data transmitted or received via the communication section 510. The function of the processing section 520 is realized by a processor such as a microcomputer.

The operation section 530 is for allowing the user to perform input operation, and can be realized by operation buttons, a touch panel display, and so on. The display section 540 is for displaying various types of information, and can be realized by a display using a liquid crystal, an organic EL, and so on. It should be noted that if the touch panel display is used as the operation section 530, it results that the touch panel display also functions as the display section 540. The storage section 550 is for storing the data, and the function thereof can be realized by a semiconductor memory such as a RAM or a ROM, a hard disk drive (HDD), or the like.

If the circuit device 500 according to the present embodiment is applied to the electronic apparatus shown in FIG. 15, it becomes possible to make efficient use of the circuit elements of the circuit device 500 to thereby realize the overdrive test. Therefore, since the reliability and so on of the circuit device 500 can be improved, it becomes possible to also improve the reliability of the electronic apparatus.

It should be noted that although the present embodiment is hereinabove explained in detail, it should easily be understood by those skilled in the art that it is possible to make a variety of modifications not substantially departing from the novel matters and the effects of the invention. Therefore, such modified examples should be included in the scope of the invention. For example, a term described at least once with a different term having a broader sense or the same meaning in the specification or the accompanying drawings can be replaced with the different term in any part of the specification or the accompanying drawings. Further, all of the combinations of the present embodiment and the modified examples are also included in the scope of the invention. Further, the configurations and the operations of the circuit device, the oscillation device, and the electronic apparatus, the overdrive method, the current control method, and so on are not limited to those explained in the present embodiment, but can be put into practice in variously modified forms.

The entire disclosure of Japanese Patent Application No. 2012-071422, filed Mar. 27, 2012 is expressly incorporated by reference herein.

What is claimed is:

1. A circuit device comprising:
a current supply circuit adapted to supply an oscillation current;
an oscillation circuit having an oscillation transistor for a resonator, and adapted to drive the resonator with the oscillation transistor based on the oscillation current from the current supply circuit; and
a control section adapted to control the current supply circuit, wherein
the oscillation circuit is configured to operate in one of a normal mode and an overdrive mode, wherein in the normal mode, the resonator is driven at a first drive power and in the overdrive mode, the resonator is driven to a second drive power greater than the first drive power,
the oscillation transistor is composed of a plurality of transistors disposed in parallel to each other between a supply node of the oscillation current and a first power supply node, and
the control section performs control of increasing the number of the transistors, which operate while being supplied with the oscillation current, in the overdrive mode compared to the normal mode.

2. An oscillation device comprising:
the circuit device according to claim 1; and
the resonator.

3. An electronic apparatus comprising the circuit device according to claim 1.

4. A circuit device comprising:
a current supply circuit adapted to supply an oscillation current;
an oscillation circuit having an oscillation transistor for a resonator, and adapted to drive the resonator with the oscillation transistor based on the oscillation current from the current supply circuit;
an overdriving drive circuit; and
a control section adapted to control the current supply circuit, wherein
the oscillation circuit is configured to operate in one of a normal mode and an overdrive mode, wherein in the normal mode, the resonator is driven at a first drive power and in the overdrive mode, the resonator is driven to a second drive power greater than the first drive power,
the oscillation circuit drives the resonator using the oscillation transistor in the normal mode, and drives the resonator using the overdriving drive circuit in the overdrive mode,
the oscillation transistor is a bipolar transistor operating while the oscillation current is supplied to the collector, and
the overdriving drive circuit is an inverter circuit composed of a P-type MOS transistor and an N-type MOS transistor connected in series with each other.

5. An oscillation device comprising:
the circuit device according to claim 4; and
the resonator.

6. An electronic apparatus comprising
circuit device according to claim 4.

7. A circuit device comprising:
a current supply circuit adapted to supply an oscillation current;
an oscillation circuit having an oscillation transistor for a resonator, and adapted to drive the resonator with the oscillation transistor based on the oscillation current from the current supply circuit; and
a control section adapted to control the current supply circuit, wherein
the oscillation circuit is configured to operate in one of a normal mode and an overdrive mode, wherein in the normal mode, the resonator is driven at a first drive power and in the overdrive mode, the resonator is driven to a second drive power greater than the first drive power,
the oscillation circuit includes a variable capacitance circuit connected to at least either one of one end and the other end of the resonator, and
the control section sets the capacitance value of the variable capacitance circuit to a smaller capacitance value in the overdrive mode compared to the normal mode.

8. The circuit device according to claim 7, wherein
the variable capacitance circuit is one of a variable capacitance circuit for controlling an oscillation frequency and a variable capacitance circuit for temperature compensation of the oscillation frequency.

9. An oscillation device comprising:
the circuit device according to claim 7; and
the resonator.

10. An electronic apparatus comprising
the circuit device according to claim 7.

* * * * *